(12) United States Patent
Kato et al.

(10) Patent No.: US 8,890,201 B2
(45) Date of Patent: Nov. 18, 2014

(54) SEMICONDUCTOR LIGHT EMITTING DEVICE

(75) Inventors: Yuko Kato, Kanagawa-ken (JP); Hidefumi Yasuda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 276 days.

(21) Appl. No.: 12/880,050

(22) Filed: Sep. 10, 2010

(65) Prior Publication Data

US 2011/0227121 A1 Sep. 22, 2011

(30) Foreign Application Priority Data

Mar. 19, 2010 (JP) .................................. 2010-065232

(51) Int. Cl.
*H01L 33/00* (2010.01)
*H01L 33/20* (2010.01)
*H01L 33/38* (2010.01)

(52) U.S. Cl.
CPC ... *H01L 33/0079* (2013.01); *H01L 2224/48247* (2013.01); *H01L 2224/48472* (2013.01); *H01L 2224/48091* (2013.01); *H01L 2933/0016* (2013.01); *H01L 33/20* (2013.01); *H01L 33/38* (2013.01)
USPC ......... 257/99; 257/79; 257/678; 257/E33.058

(58) Field of Classification Search
CPC ....................................................... H01L 3/003
USPC ............................................... 257/99, 79, 678
See application file for complete search history.

(56) References Cited

U.S. PATENT DOCUMENTS

| | | | |
|---|---|---|---|
| 5,686,737 A * | 11/1997 | Allen ............................... | 257/77 |
| 7,453,099 B2 | 11/2008 | Kato et al. | |
| 7,501,665 B2 | 3/2009 | Yasuda et al. | |
| 2005/0151136 A1* | 7/2005 | Liu ................................. | 257/79 |
| 2006/0231852 A1* | 10/2006 | Kususe et al. ................... | 257/99 |
| 2007/0069394 A1* | 3/2007 | Bachman et al. ............. | 257/780 |
| 2008/0246051 A1* | 10/2008 | Hosokawa et al. ............. | 257/99 |
| 2009/0045425 A1* | 2/2009 | Yasuda et al. ................... | 257/98 |

FOREIGN PATENT DOCUMENTS

| | | |
|---|---|---|
| JP | 2-125637 | 5/1990 |
| JP | 06-053552 | 2/1994 |
| JP | 2002-171000 | 6/2002 |
| JP | 2009-176966 | 8/2009 |

OTHER PUBLICATIONS

Japanese Office Action dated Jun. 13, 2012, filed in Japanese counterpart Application No. 2010-065232, 5 pages (with English translation).

Japanese Office Action dated May 9, 2014, filed in Japanese counterpart Application No. 2013-084385, 4 pages (with translation).

* cited by examiner

*Primary Examiner* — Dale E Page
(74) *Attorney, Agent, or Firm* — Patterson & Sheridan, LLP (57) ABSTRACT

According to one embodiment, in a semiconductor light emitting device, a first electrode is provided on a first surface of the semiconductor laminated body including a light emitting layer. A joint metal layer is provided on a second surface of the semiconductor laminated body opposed to the first surface of the semiconductor laminated body. A bonding metal layer covers a first surface of the joint metal layer on a side opposite to the semiconductor laminated body and is provided on a side of the second surface of the semiconductor laminated body. A substrate provided with a second electrode is bonded to the bonding metal layer. A layer having an etching resistance property to an etchant for etching the semiconductor laminated body is formed on a side of the surface of the bonding metal layer facing to the semiconductor laminated body.

14 Claims, 9 Drawing Sheets

SEMICONDUCTOR LIGHT EMITTING DEVICE

CROSS REFERENCE TO RELATED APPLICATION

This application is based upon and claims the benefit of priority from the prior Japanese Patent Application No. 2010-065232, filed on Mar. 19, 2010, the entire contents of which are incorporated herein by reference.

FIELD

Embodiments described herein relate generally to a semiconductor light emitting device.

BACKGROUND

Conventionally, a semiconductor light emitting device such as a light emitting diode and so on is constructed so that a bonding metal layer, a contact metal (a joint metal layer) and a semiconductor layer (a contact layer, a lower current spreading layer, a light emitting layer, an upper current spreading layer and a contact layer in this order from the lowest layer) are laminated in this order from the lowest layer on a main surface of a substrate at a rear face of which a rear face electrode is formed, and a bonding pad is provided on the semiconductor layer.

As a method for manufacturing such the semiconductor light emitting device, a method is known that after the semiconductor layer formed on a substrate of GaAs system, for example, by epitaxially growing the contact layer, the lower current spreading layer, the light emitting layer, the upper current spreading layer and the contact layer in this order from the lowest layer are bonded to the substrate via the joint metal layer and the bonding metal layer, the substrate of GaAs system is removed, the bonding pad is formed on the contact layer connected to the upper current spreading layer, and the rear face electrode is formed at the rear face of the substrate.

Then, using a laser dicing method, for example, this is separated into a plurality of the chip-shaped semiconductor light emitting devices. At the time of separating, as a result that a mechanical force heading upward is given to the semiconductor layer and so on, the damage and peeling off of the film may possibly occur in the semiconductor layer and so on. If the damage occurs in the semiconductor layer, for example, there is a case that the light emitting area of the semiconductor light emitting device decreases and the light emitting efficiency decreases.

Consequently, as a method to prevent the damage and peeling off of the film from occurring in the semiconductor layer and so on, a method is known that from a GaAs layer formed on a Si substrate, the epitaxial GaAs layer in the vicinity of the device boundary is selectively removed to form a dicing street. A method for manufacturing a semiconductor light emitting device of this kind is disclosed in JP 2-125637.

However, in the method for manufacturing the semiconductor light emitting device of this kind, even if the dicing street is formed and passivation films are formed on the surface of the semiconductor layer and at the side face of the joint metal layer before separating into the chip-shaped semiconductor light emitting devices, as a result that a mechanical force heading upward remains to be given to the passivation film and so on at the time of separating into the chip shaped semiconductor light emitting devices, peeling off of the film may possibly occur in the passivation film at the side face of the joint metal layer. As a result, the side face of the joint metal layer may possibly expose and be corroded.

BRIEF DESCRIPTION OF THE DRAWINGS

FIGS. 2A to 3D are cross-sectional views showing manufacturing steps of the semiconductor light emitting device according to the embodiment;

DETAILED DESCRIPTION

According to one embodiment, in a semiconductor light emitting device, a first electrode is provided on a first surface of the semiconductor laminated body including a light emitting layer. A joint metal layer is provided on a second surface of the semiconductor laminated body opposed to the first surface of the semiconductor laminated body. A bonding metal layer covers a first surface of the joint metal layer on a side opposite to the semiconductor laminated body and is provided on a side of the second surface of the semiconductor laminated body. A substrate provided with a second electrode is bonded to the bonding metal layer. A layer having an etching resistance property to an etchant for etching the semiconductor laminated body is formed on a side of the surface of the bonding metal layer facing to the semiconductor laminated body.

Hereinafter, one embodiment will be described with reference to the drawings. In the drawings, same reference characters denote the same or similar portions. The dimensional ratio in the drawing is not limited to the ratio as shown in the figure.

Figure 1:
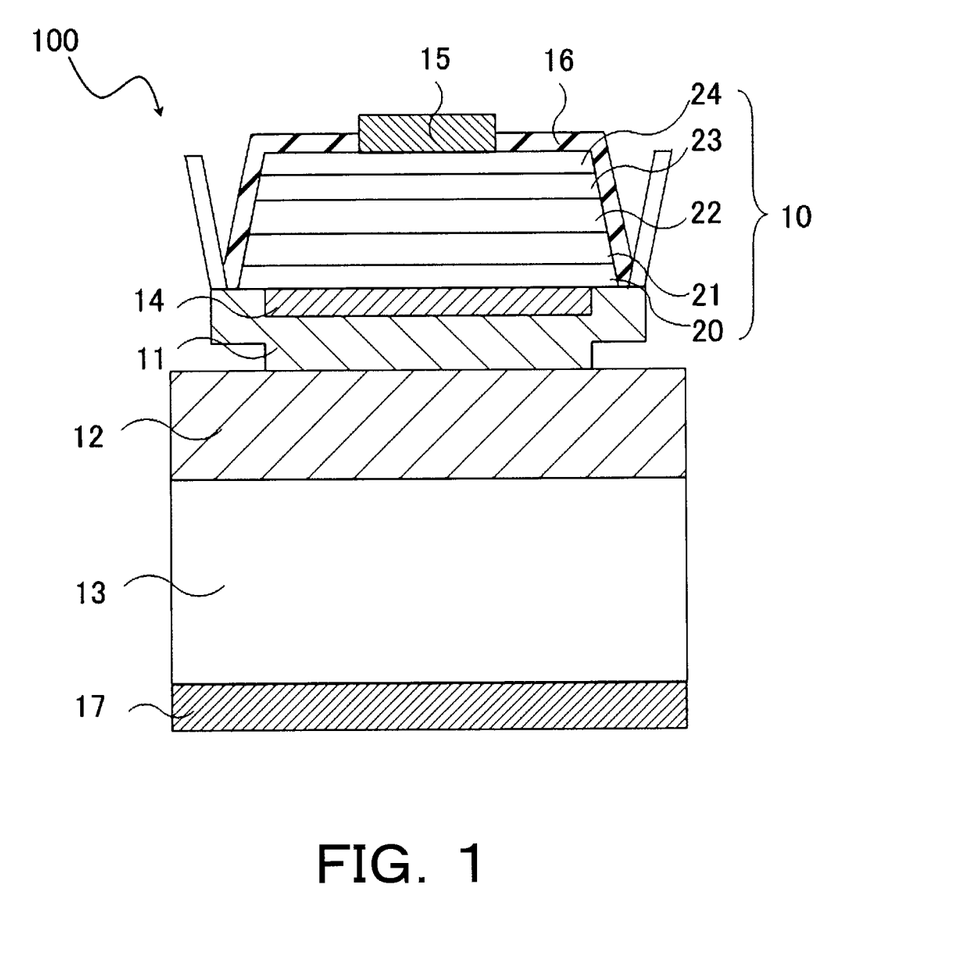
FIG. 1 is a cross-sectional view showing a semiconductor light emitting device according to an embodiment.

A semiconductor light emitting device in an embodiment will be described with reference to FIG. 1. A semiconductor light emitting device 100 is provided with a semiconductor layer (a semiconductor body) 10 including a light emitting layer 22, a substrate 13 bonded to the semiconductor layer 10 via a bonding metal layer (a second metal layer) 11, a bonding metal layer 12 and a joint metal layer (a first metal layer) 14 covered by the semiconductor layer 10 and the bonding metal layer 11 and so on. In addition, in the semiconductor light emitting device 100, the light emitted from a light emitting layer 22 described later is extracted from an upper side in FIG. 1, that is a side opposite to the substrate 13.

The semiconductor layer 10 is composed by laminating a second contact layer 20, a second current spreading layer 21, the light emitting layer 22, a first current spreading layer 23, a first contact layer 24 in this order from the lowest layer. Here, the light emitting layer 22 may be constructed to include a cladding layer and a superlattice layer and so on. In addition, such a construction may be used that the first and second current spreading layers 23, 21 are included in the first and second contact layers 24, 20, respectively or are included in the cladding layer of the light emitting layer 22. An etching processing is performed, for example, so that the semiconductor layers 10 are separated and formed at a predetermined distance. The formed predetermined distance becomes a dicing street.

The boundary face between the second contact layer 20 and the joint metal layer 14 has an ohmic contact. Similarly, the boundary face between the first contact layer 24 and an upper face electrode (also called as a first electrode) 15 has an ohmic contact.

InAlP, InGaAlP can be used as the cladding layer and a multiple quantum well structure (also called as an MQW) of InGaP/InGaAlP and InGaN/GaN/AlGaN can be used as the light emitting layer 22, for example. In addition, InGaAlP and GaN are used as the second current spreading layer 21 and the first current spreading layer 23, for example. The second current spreading layer 21 and the first current spreading layer 23 have a function to spread the current from the upper face electrode 15 or a rear face electrode (also called as a second electrode) 17 in a plane direction. GaAs is used as the first contact layer 24 and the second contact layer 20, for example. Or, AlGaN can be used as the cladding layer, a multiple quantum well structure of AlGaN/AlInGaN can be used as the light emitting layer 22, and GaN can be used as the first contact layer 24 and the second contact layer 20.

In addition, material of each layer is not limited to the above-described, but other semiconductor materials may be used.

The substrate 13 has electrical conductivity to ensure the conduction between the upper face electrode 15 and the rear face electrode 17. A silicon substrate is used as the substrate 13, for example. In addition, Ge, InP, GaP, GaAs, GaN, SiC may be used as the material of the substrate 13. In addition, the bonding metal layer 12 is formed on an upper face of the substrate 13, and a rear face electrode 17 is formed at a rear face (a face opposite to the main face) of the substrate 13.

A metallic Ag layer is used as the joint metal layer 14, for example. The metallic Ag layer has a high light reflection coefficient and reflects the light emitted from the light emitting layer 22 upward. The joint metal layer 14 functions as jointing the bottom of the semiconductor layer 10 to the bonding metal layer 11 and reflecting the light.

The joint metal layer 14 is formed so as to contact the surface (the first surface) of the semiconductor layer 10 on the substrate 13 side, and is formed so as to be covered with the semiconductor layer 10 and the bonding metal layer 11. Here, the joint metal layer 14 is formed so as not to protrude from the surface of the semiconductor layer 10 on the substrate 13 side as shown in FIG. 1. In other words, the surface of the semiconductor layer 10 on the substrate 13 side contacts not only with the joint metal layer 14 but also with the bonding metal layer 11.

Figure 7:
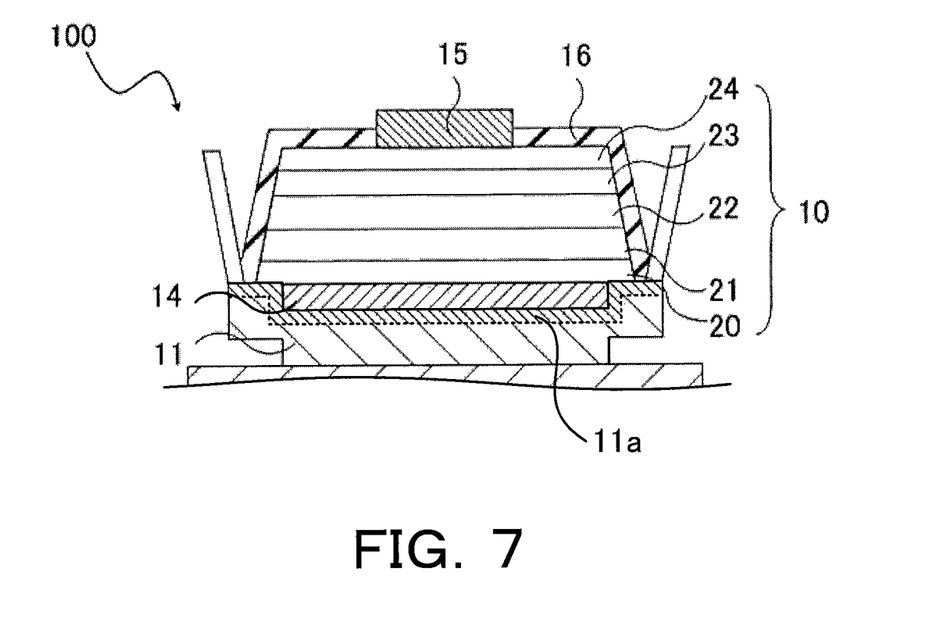
FIGS. 7 to 9 are cross-sectional views showing another semiconductor light emitting device according to the embodiment.

An Ni layer is formed in the bonding metal layer 11 on the semiconductor layer 10 side. A layer formed by laminating an Au layer, a Pt layer, a Ti layer and an Ni layer in this order from the surface on the substrate 13 side, for example, is used as the bonding metal layer 11. The Ni layer functions as a stopper film at the time of dry etching. FIG. 7 shows the semiconductor light emitting device 100 in which an Ni layer 11a is formed in the bonding metal layer 11 on the semiconductor layer 10 side. The Ni layer 11a covers the bottom face of the joint metal layer 14 and side faces of the joint metal layer 14, and also covers the bottom face of the second current spreading layer 21 other than a portion the joint metal layer 14 is provided below.

Figure 8:
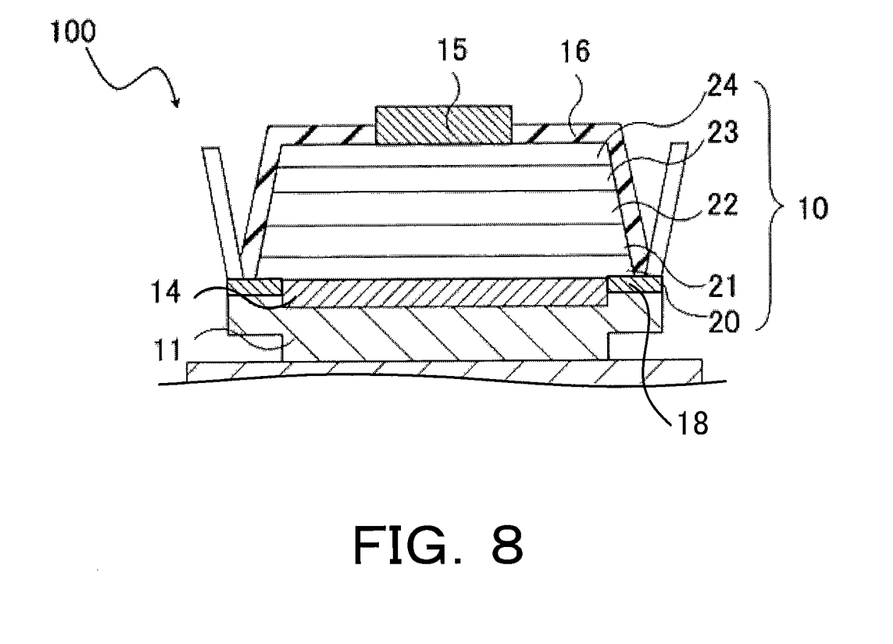

In addition, an Ni layer functions as a stopper film may be formed between the bonding metal layer 11 on the semiconductor layer 10 side and the semiconductor layer 10. In place of the Ni layer, a layer including a silicon oxide, a layer including a silicon nitride, a layer including a silicon oxynitride and so on may be used, for example. FIG. 8 shows the semiconductor light emitting device 100 in which a stopper film 18 is formed between the bonding metal layer 11 on the semiconductor layer 10 side and the semiconductor layer 10. The stopper film 18 covers a bottom face of the second current spreading layer 21 other than a portion the joint metal layer 14 is provided below.

Figure 9:
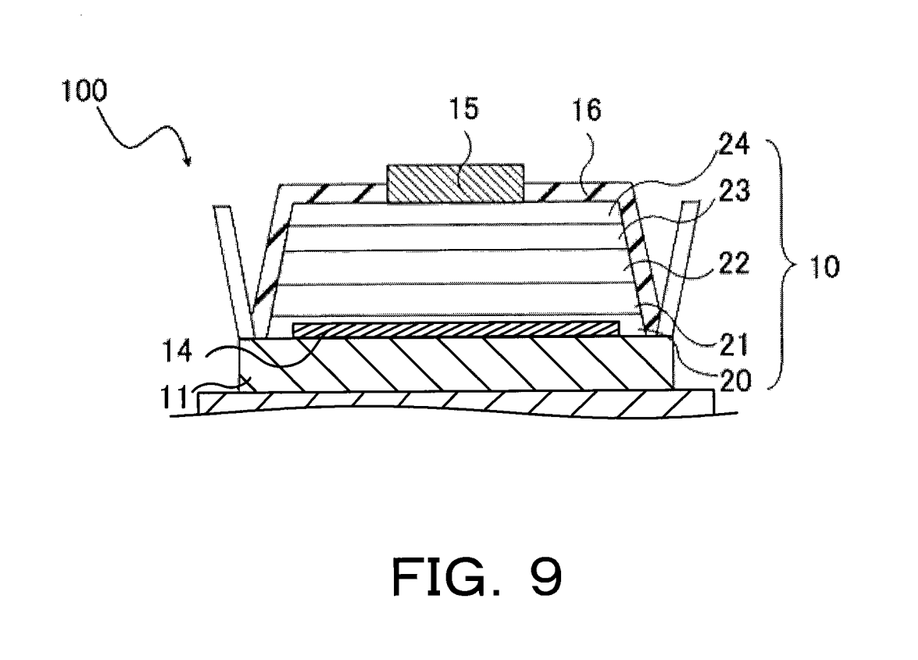

In addition, it is sufficient that the joint metal layer 14 is not exposed by the semiconductor layer 10 and the bonding metal layer 11, and other configuration may be used. A configuration that the joint metal layer 14 is buried in the semiconductor layer 10 may be used. FIG. 9 is a view showing a configuration that the joint metal layer 14 is buried in the semiconductor layer 10. As shown in FIG. 9, the joint metal layer 14 is buried in the second contact layer 20 out of the semiconductor layer 10 in such a manner that the first surface in contact with the bonding metal layer 11 is flush with the second surface of the semiconductor layer 10. By this, the bonding metal layer 11 becomes a flat configuration without generating steps by the joint metal layer 14.

Next, a method for manufacturing a semiconductor light emitting device 100 of the embodiment will be described with reference to process charts of FIGS. 2A to 3D.

Figure 2A:
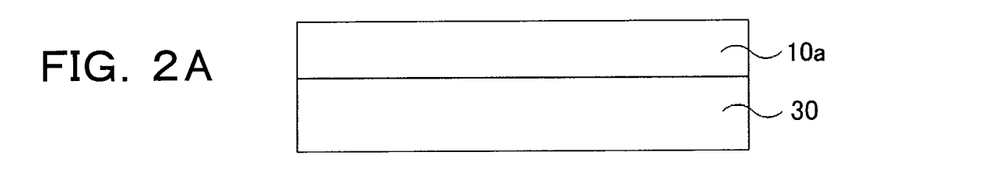

As shown in FIG. 2A, the semiconductor layer 10a is formed on the surface of a growth substrate 30 by being epitaxially grown using an MOCVD method. GaAs is used as the growth substrate 30 in the case of an InGaAlP system light emitting device, for example. In addition, in the case of a GaN system light emitting device, sapphire, GaN, SiC and so on are used.

Figure 2B:
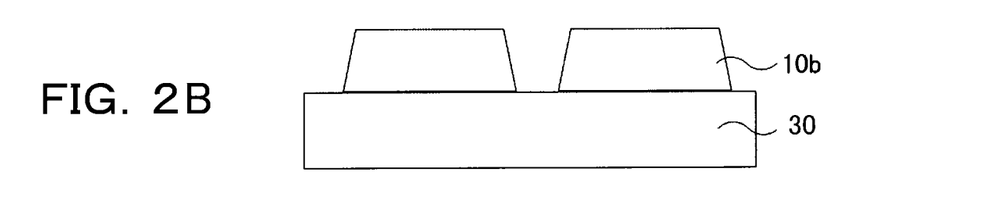

As shown in FIG. 2B, a photo resist (not shown) is coated on the surface of the semiconductor layer 10a, and a desired resist pattern is formed so that the semiconductor layers 10a are formed separately at a predetermined distance using a photolithography technology. Then, the semiconductor layer 10a is processed by dry etching using the resist pattern as a mask, and the semiconductor layer 10b is formed.

Figure 2C:
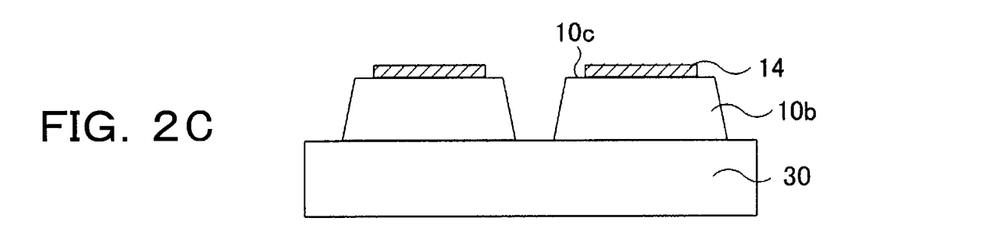

As shown in FIG. 2C, a material used for the joint metal layer 14 is evaporated (deposited) on the semiconductor layer 10b and on the growth substrate 30 using a resist liftoff method, for example, to form the joint metal layer 14. After the heat treatment, the boundary face between the semiconductor layer 10b and the joint metal layer 14 has an ohmic contact.

A portion of a face 10c which is not covered with the joint metal layer 14 and is opposite to a face contacting with the growth substrate 30 is exposed.

Figure 2D:
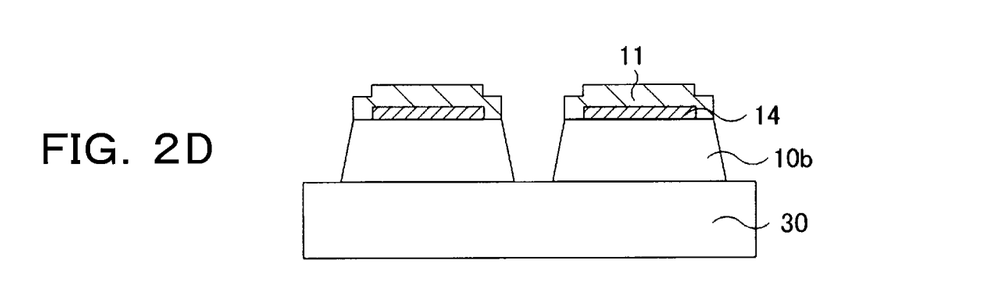

As shown in FIG. 2D, the bonding metal layer 11 is formed on the joint metal layer 14, the growth substrate 30 and the semiconductor layer 10b, with a material used for the bonding metal layer 11 by the resist liftoff method, for example. In this time, the bonding metal layer 11 is shaped so as to cover the exposed surface of the joint metal layer 14. In addition, as the bonding metal layer 11 is formed on the joint metal layer 14, the bonding metal layer 11 is shaped so that the step of the joint metal layer 14 is reflected. In addition, after the bonding metal layer 11 is formed, out of the surface of the semiconductor layer 10b, a portion of the face 10c opposite to the face contacting with the growth substrate 30 may be exposed.

Figure 3A:
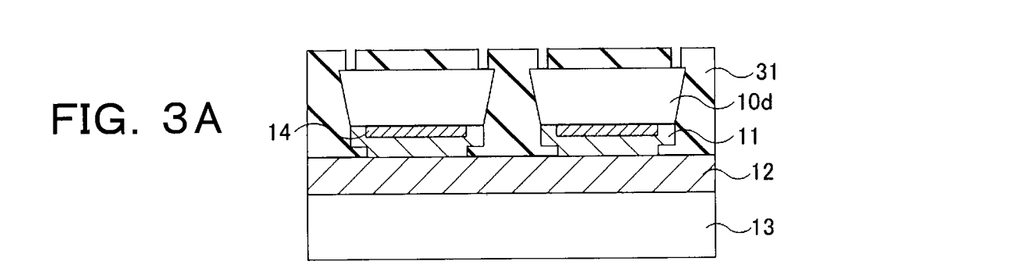

As shown in FIG. 3A in which the figure is upside down, the bonding metal layer 12 formed on the surface of the substrate 13 is in contact with the bonding metal layer 11 and bonded to the bonding metal layer 11. In the state that bonding metal layers 11, 12 are press contacted with each other, they are heated to bond to each other. The growth substrate 30 is removed by a wet etching method or a laser liftoff method, for example.

Next, the semiconductor layer 10 is formed taper shaped in the following processes. The damaged portion which is formed during the bonding process or the growth substrate 30 removing process is removed so as to reduce optical loss. An, insulating film 16 described later is easily formed on the semiconductor layer 10 in case the semiconductor layer 10 is tapered to upside as in FIG. 1.

After the growth substrate 30 is removed, a photo resist 31 with a desired shape which has an opening (trench) is formed, for example, as shown in FIG. 3A. This shape is made such a shape that only the surface of the bonding metal layer 11 and the semiconductor layer 10 are exposed when the semiconductor layer 10d is dry etched as described later.

Figure 3B:
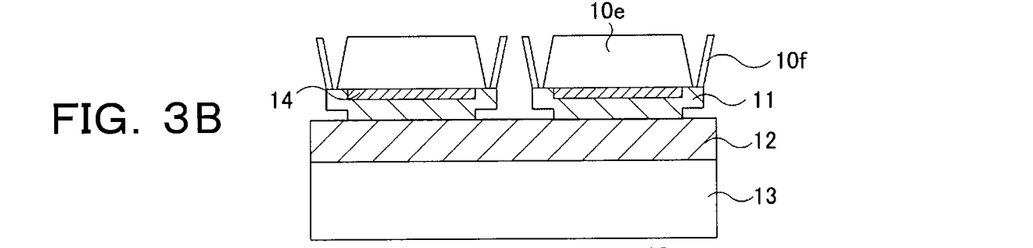

As shown in FIG. 3B, the semiconductor layer 10 is dry etched until the top surface of the bonding metal layer 11 is exposed while making the photo resist 31 recede. By this, the semiconductor layer 10e is formed with a tapered shape that the width of the semiconductor layer 10 becomes smaller in a direction from downward to upward in FIG. 3B. In case that the shape of the photo resist is a shape as shown in FIG. 3A, a side wall film 10f remains after dry etching as shown in FIG. 3B. After the semiconductor layer 10e is formed, the photo resist 31 is removed by ashing or by organic solvent. A portion of the top surface of the bonding metal layer 11 is exposed between the semiconductor layer 10 and the side wall film 10f.

In addition, the side wall film 10f may be removed. A shape that the side wall film 10f does not remain can be made by controlling a material and a shape of the mask member used at the time of dry etching the semiconductor layer 10d. In addition, the shape of the semiconductor layer 10e is not limited to a tapered shape, but other shapes (a vertical shape, for example) may be used. In addition, a side face of the semiconductor layer 10e may arbitrarily be processed in order to improve extracting property of the emitted light.

Figure 3C:
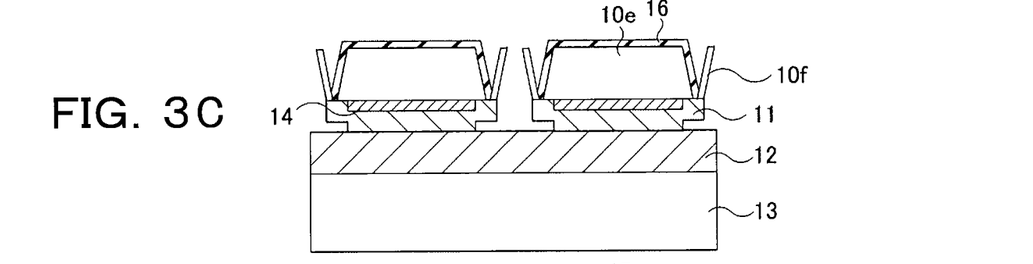

As shown in FIG. 3C, the insulating film 16 which is transmissive to a light from light emitting layer is formed by a CVD method or a coating method, for example, on the taper shaped semiconductor layer 10e and the bonding metal layer 11 exposed by dry etching. The insulating film 16 functions as a protective film for the surface of the semiconductor layer 10, and improve extracting property of the light by setting a refractive index and a film thickness of the insulating film 16. The exposed surface of the bonding metal layer 11 between the semiconductor layer 10e and the side wall film 10f is covered with the insulating film 16.

Figure 3D:
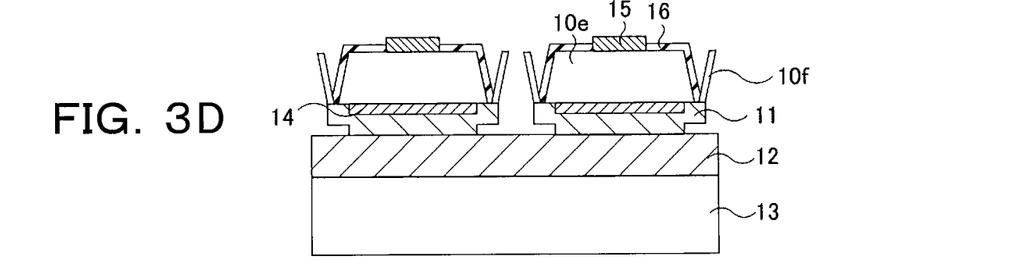

As shown in FIG. 3D, the insulating film 16 is processed by a photolithography technology using a desired resist pattern as a mask so as to open a portion of the upper face (the second surface) of the semiconductor layer 10e, and a material used for the upper face electrode 15 at an opening on the upper face of the semiconductor layer 10e is buried to form the upper face electrode 15.

In addition, the upper face of the semiconductor layer 10e (the face opposite to the face on the junction metal layer 14 side) may be formed concave and convex to improve the light extracting property. In this case, the semiconductor layer 10e is processed before forming the insulating film 16 and then the insulating film 16 may be formed, and after the insulating film 16 is formed, the insulating film 16 formed on the upper face of the semiconductor layer 10e may be opened and processed.

Next, a packaged semiconductor light emitting device 200 loaded with the above-described semiconductor light emitting device 100 will be described with reference to FIG. 4. Hereinafter, a semiconductor light emitting device 200 of a resin sealed type called the "bullet type" and so on will be described as an example.

A packaged semiconductor light emitting device 20 0 is provided with the semiconductor light emitting device 100, leads 101, 102, a wire 104 and a light transmissive resin 105 and so on.

A cup portion 103 is provided on top of the lead 101, and the semiconductor light emitting device 100 is mounted on the bottom face of the cup portion 103 with conductive paste or the like. By this, the rear face electrode 17 of the semiconductor light emitting device 100 and the lead 101 are connected.

In addition, the upper face electrode 15 of the semiconductor light emitting device 100 and the other lead 102 are connected electrically with the wire 104. Though the semiconductor light emitting device 100 is of a thin film, a stress at the time of bonding is reduced by providing the bonding metal layers 11 and 12, and the packaged semiconductor light emitting device 200 with high reliability is realized. An inner wall face 103a of the cup portion 103 forms a light reflecting face, which reflects the light emitted from the semiconductor light emitting device 100 and allows the light to be extracted upward.

The cup portion 103 is sealed with the light transmissive resin 105. A light extracting face 105a of the resin 105 forms a light condensing curved surface, which can appropriately condense the light emitted from the semiconductor light emitting device 100 to achieve a predetermined light distribution.

Figure 4:
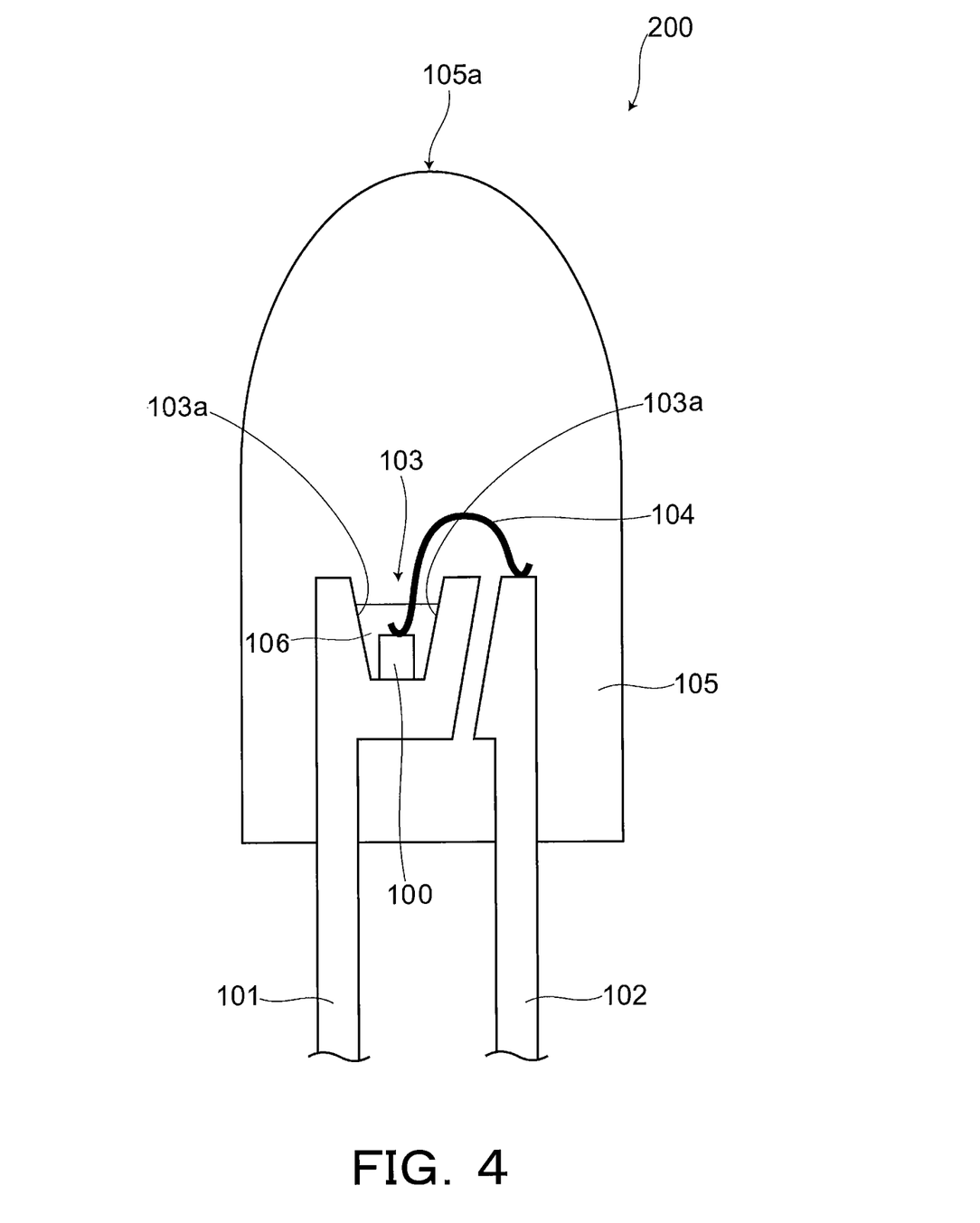
FIG. 4 is a cross-sectional view showing a packaged semiconductor light emitting device according to the embodiment.

As shown in FIG. 4, a fluorescent substance layer 106 is provided at the cup portion 103 so as to cover the semiconductor light emitting device 100, for example. By this, a light with a different color can be extracted from the light emitted from the semiconductor light emitting device 100. In the case of extracting a white light using the semiconductor light emitting device 100 to emit a blue light, for example, the fluorescent substance layer 106 is made to include a fluorescent substance which is excited by the blue light to emit a yellow light By the above description, the embodiment can provide the semiconductor light emitting device 100 and the packaged semiconductor light emitting device 200 which can suppress the corrosion of the joint metal layer 14. Hereinafter, this will be described specifically.

In the embodiment, as the joint metal layer 14 is formed to be sandwiched between the bonding metal layer 11 and the semiconductor layer 10, and the semiconductor layer 10 is isolated for each device, in the case of separating into the chip shaped semiconductor light emitting device, it is enough to cut only the bonding metal layer 12 and the substrate 13. And as a force is not given directly to the semiconductor layer 10, the bonding metal layers 11 and the joint metal layer 14 which are bonded to the semiconductor layer 10, the surface including side surfaces of the joint metal layer 14 is not exposed. As a result, the corrosion of the joint metal layer 14 by chemicals and so on used in another manufacturing process of the semiconductor light emitting device, for example, can be prevented, and the reliability of the semiconductor light emitting device and the packaged semiconductor light emitting device can be improved.

In the method for manufacturing the conventional semiconductor light emitting device, the area of the joint metal layer contacting with the semiconductor layer has an area approximately the same as the surface of the semiconductor layer on the substrate side. Therefore, in the process of FIG. 3 B, in the case of processing the semiconductor layer into the tapered shape, a portion of the joint metal layer exposes by the dry etching. As a result that the material of the joint metal layer reacts with an etchant, and the reaction product adheres to the side face of the semiconductor layer, a leak current from the side face of the semiconductor layer may increase at the time of emitting the light.

However, in the embodiment, the area of the joint metal layer 14 contacting with the semiconductor layer 10 is smaller than that of the surface of the semiconductor layer 10 on the substrate 13 side. Therefore, in the process of FIG. 3B, in the case of processing the semiconductor layer 10 into the tapered shape, a portion of the joint metal layer does not expose by the dry etching. As the exposed surface of the bonding metal layer 11 is a material having the etching-resistant property, the reaction product does not easily adhere to the side face of the semiconductor layer. Therefore, a leak current from the semiconductor layer 10 can be reduced.

Therefore, the decrease in the light emitting efficiency of the semiconductor light emitting device and the packaged semiconductor light emitting device can be prevented.

Figure 5:
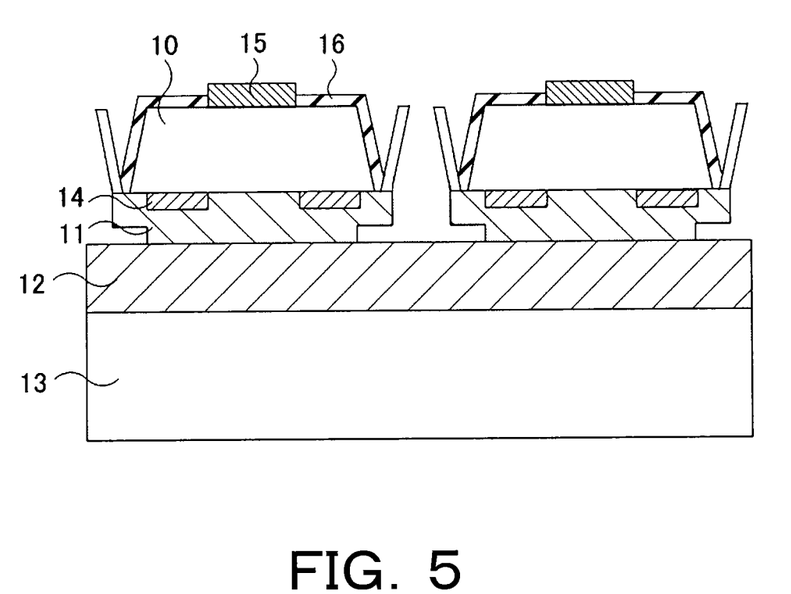
FIG. 5 is a cross-sectional view showing a semiconductor light emitting device according to a first modification of the embodiment.

As a first modification of the embodiment, a configuration can be used that the joint metal layer 14 is formed so as to avoid just under the upper face electrode 15 as shown in FIG. 5. In addition, the number and the shape of the formed joint metal layers 14 are not limited.

In the semiconductor light emitting device of the embodiment, the light emitted from the light emitting layer and heading for the joint metal layer 14 side is extracted from the upper face by the reflection at the surface of the joint metal layer 14. As the joint metal layer 14 is not provided just under the upper face electrode 15 as in the first modification, the current distribution and light emitting distribution can be induced to a place avoiding just under the upper face electrode 15. Therefore, the amount of the emitted light not shielded by the upper face electrode 15 increases, and the amount of the light which comes and goes between the upper face electrode 15 and the joint metal layer 14 and is not extracted to the outside from the semiconductor layer 10 can be reduced. Therefore, the light emitting efficiency of the semiconductor light emitting device can be improved.

In addition, with respect to the method for manufacturing the joint metal layer 14 of the first modification, except that the resist pattern used in the case of forming the joint metal layer 14 is changed, the other manufacturing method is the same as in the embodiment.

Figure 6:
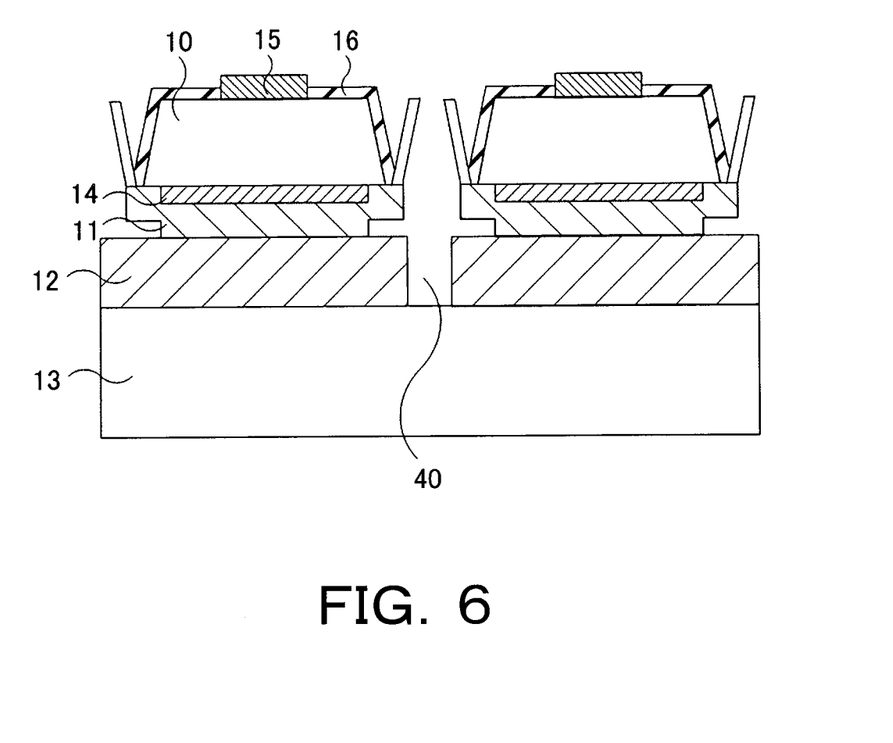
FIG. 6 is a cross-sectional view showing a semiconductor light emitting device according to a second modification of the embodiment.

In the embodiment, the bonding metal layer 12 is formed on the face of the substrate 13, but in a second modification, a device isolating area 40 may be formed in the bonding metal layer 12, as shown in FIG. 6.

For the reason, in the case of the laser dicing method, for example, a portion to which the laser is irradiated is only the substrate 13. As a result, the damage and peeling off of the film become more difficult to occur in the semiconductor layer 10 and the bonding metal layer 11 and so on, compared with the embodiment.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor light emitting device, comprising:
   a semiconductor layer including a light emitting layer, the semiconductor layer including a first surface and a second surface;
   a first metal layer provided on the first surface, the first metal layer including a third surface and a sidewall, the third surface being on a side opposite the semiconductor layer;
   a second metal layer directly contacting the first surface, the third surface, the sidewall, and an end portion of an insulating film disposed on the semiconductor layer;
   a first electrode provided on the second surface; and
   a substrate provided with a second electrode and provided on the second metal layer,
   wherein the first metal layer is provided between the second metal layer and the semiconductor layer, a width of the semiconductor layer becomes wider from the first electrode to the substrate, and
   the first metal layer is surrounded by the semiconductor layer and the second metal layer.

2. The device of claim 1, wherein an area of the first metal layer facing the semiconductor layer is smaller than an area of the semiconductor layer facing the first metal layer.

3. The device of claim 2, wherein the second metal layer directly contacts the sidewall of the first metal layer and the third surface of the first metal layer.

4. The device of claim 1, wherein the first metal layer is provided on a first portion of the first surface of the semiconductor layer, the first portion not including a second portion of the first surface of the semiconductor layer.

5. The device of claim 1, wherein the second metal layer includes a nickel layer, a titanium layer, a platinum layer, and a gold layer, which are laminated from the first surface of the semiconductor layer in this order.

6. The device of claim 1, wherein the first metal layer is a silver layer.

7. The device of claim 1, wherein the second metal layer includes a nickel layer or a platinum layer.

8. The device of claim 1, wherein the insulating film is transmissive to a light of a luminescence wavelength and is formed on a portion of the second surface of the semiconductor layer, a sidewall of the semiconductor layer and a peripheral portion of the second metal layer which protrudes beyond the semiconductor layer.

9. The device of claim 1, wherein the first metal layer is embedded in the semiconductor layer in such that the third surface of the first metal layer that is in contact with the second metal layer is planar with the first surface of the semiconductor layer.

10. A semiconductor light emitting device, comprising:
    a semiconductor layer including a light emitting layer, the semiconductor layer having a first surface and a second surface;
    a first layer disposed on the first surface, the first layer having a third surface, the third surface being on a side opposite the semiconductor layer, the first layer including a metal;
    a second layer disposed on the first surface and the third surface, the second layer including a third layer and a fourth layer, the third layer comprising platinum, the fourth layer comprising titanium, the fourth layer being disposed between the third layer and the semiconductor layer, the second layer having a first region that is directly contacting the first surface, the first region including silicon nitride, an interface between the first region and the semiconductor layer being coplanar with an interface between the first layer and the semiconductor layer;

a first electrode provided on the second surface; and a substrate on which a second electrode is disposed, the substrate provided on the second layer, wherein the first layer is provided between the second layer and the semiconductor layer, a width of the semiconductor layer becomes wider from the first electrode to the substrate, and the first layer is directly contacting the semiconductor layer and the second layer.

11. The device of claim 10, wherein the first layer comprises silver.

12. The device of claim 10, wherein an area of the first layer facing the semiconductor layer is smaller than an area of the semiconductor layer facing the first layer.

13. The device of claim 10, wherein the fourth layer is disposed on a sidewall of the first layer and the third surface of the first layer.

14. The device of claim 10, wherein the first layer is provided on a first portion of the first surface of the semiconductor layer, the first portion not including a second portion of the first surface of the semiconductor layer.

* * * * *